(12) United States Patent  
Qi et al.

(10) Patent No.: US 11,653,529 B2
(45) Date of Patent: May 16, 2023

(54) DISPLAY SUBSTRATE COMPRISING FINGERPRINT RECOGNITION SENSORS, METHOD FOR MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Mingchun Qi, Beijing (CN); Mengxia Kong, Beijing (CN); Xuwu Hu, Beijing (CN); Donghui Si, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/881,045

(22) Filed: Aug. 4, 2022

(65) Prior Publication Data

US 2022/0376005 A1  Nov. 24, 2022

Related U.S. Application Data

(62) Division of application No. 16/641,754, filed as application No. PCT/CN2018/117167 on Nov. 23, 2018, now Pat. No. 11,476,312.

(51) Int. Cl.
*G06V 40/13* (2022.01)

(52) U.S. Cl.
CPC ........ *H10K 59/00* (2023.02); *G06V 40/1306* (2022.01); *H10K 59/122* (2023.02);
(Continued)

(58) Field of Classification Search
CPC ..... G06K 9/0002; G06F 3/041; G06F 3/0414; G06F 3/04144; H01L 41/0805; G06V 40/1318; G06V 40/1306
See application file for complete search history.

(56) References Cited

U.S. PATENT DOCUMENTS

2018/0068151 A1  3/2018  Sun et al.
2018/0268187 A1  9/2018  Jeong et al.
(Continued)

FOREIGN PATENT DOCUMENTS

CN    106326877 A        1/2017
CN    106446817 A  *   2/2017  ........... G06F 3/0412
(Continued)

OTHER PUBLICATIONS

PCT International Search Report, Application No. PCT/CN2018/117167, dated Aug. 12, 2019, 6 pages: with English translation.
(Continued)

*Primary Examiner* — Yuzhen Shen
(74) *Attorney, Agent, or Firm* — Armstrong Teasdale LLP

(57) ABSTRACT

Embodiments of the present disclosure relate to a display substrate, a method for manufacturing the same, and a display device. The display substrate includes a substrate, a pixel definition layer for defining pixels on the substrate, the pixel definition layer including a plurality of inter-pixel portions located between adjacent pixels, and a fingerprint recognition sensor located in the inter-pixel portions.

3 Claims, 13 Drawing Sheets

(52) U.S. Cl.
CPC ............. *H10K 71/00* (2023.02); *H10N 39/00* (2023.02); *H10K 59/1201* (2023.02)

(56) References Cited

U.S. PATENT DOCUMENTS

| | | | |
|---|---|---|---|
| 2019/0065805 A1* | 2/2019 | Zhao | G09G 3/3208 |
| 2019/0095015 A1 | 3/2019 | Han et al. | |
| 2019/0095046 A1* | 3/2019 | Guo | G06F 3/043 |
| 2019/0251378 A1* | 8/2019 | Jung | B06B 1/0629 |
| 2019/0363241 A1 | 11/2019 | Huang | |
| 2020/0218866 A1* | 7/2020 | Yang | G06V 40/1312 |

FOREIGN PATENT DOCUMENTS

| | | | | |
|---|---|---|---|---|
| CN | 106446817 A | | 2/2017 | |
| CN | 106530968 A | * | 3/2017 | ......... G01S 15/8925 |
| CN | 106530968 A | | 3/2017 | |
| CN | 106782085 A | | 5/2017 | |
| CN | 106951130 A | | 7/2017 | |
| CN | 107194384 A | | 9/2017 | |
| CN | 107368227 A | * | 11/2017 | .......... B06B 1/0622 |
| CN | 108846318 A | | 11/2018 | |

OTHER PUBLICATIONS

PCT Written Opinion, Application No. PCT/CN2018/117167, dated Aug. 12, 2019, 5 pages.: with English translation of relevant part.
Office Action issued in U.S. Appl. No. 16/641,754, dated Dec. 17, 2021, 21 pages.
Office Action issued in U.S. Appl. No. 16/641,754, dated Apr. 1, 2022, 15 pages.
Restriction Requirement issued in U.S. Appl. No. 16/641,754, dated Sep. 21, 2021, 6 pages.
Notice of Allowance issued in U.S. Appl. No. 16/641,754, dated Jun. 13, 2022, 7 pages.

* cited by examiner

DISPLAY SUBSTRATE COMPRISING FINGERPRINT RECOGNITION SENSORS, METHOD FOR MANUFACTURING THE SAME, AND DISPLAY DEVICE

CROSS REFERENCE TO RELATED APPLICATIONS

This patent application is a divisional application of U.S. patent application Ser. No. 16/641,754, which is a National Stage Entry of PCT/CN2018/117167 filed on Nov. 23, 2018, the disclosures of which are incorporated by reference herein in their entirety as part of the present application.

BACKGROUND

Embodiments of the present disclosure relate to the field of display technology, and in particular, to a display substrate, a method for manufacturing the same, and a display device.

Since fingerprints have characteristics of invariance, uniqueness and convenience, they have almost become synonymous with biometric identification. Fingerprint refers to ridge lines produced by unevenness on a front skin of an end of a human finger. The ridge lines are regularly arranged to form different patterns. A starting point, an ending point, a joining point, and a bifurcation point of the ridge lines are called as minutiae. Fingerprint recognition refers to identification performed by comparing the minutiae of different fingerprints. Fingerprint recognition technology involves many disciplines such as image processing, pattern recognition, computer vision, mathematical morphology, wavelet analysis, etc. As the fingerprints are different among persons and even fingerprints of ten fingers of one person are significantly different, the fingerprints can be used for identity authentication and can replace traditional passwords to achieve higher and more secure secrecy. Therefore, the display devices having fingerprint recognition function have become increasingly popular.

BRIEF DESCRIPTION

Embodiments of the present disclosure provide a display substrate and a method for manufacturing the same.

One aspect of the present disclosure provides a display substrate. The display substrate includes a substrate, a pixel definition layer for defining pixels on the substrate, the pixel definition layer including a plurality of inter-pixel portions located between adjacent pixels, and a fingerprint recognition sensor located in at least one of the inter-pixel portions.

In an embodiment of the present disclosure, the fingerprint recognition sensor is an ultrasonic fingerprint recognition sensor, and the ultrasonic fingerprint recognition sensor includes a generator and a receiver.

In an embodiment of the present disclosure, the generator and the receiver are located in different inter-pixel portions, respectively.

In an embodiment of the present disclosure, the generator and the receiver are located in a same inter-pixel portion.

In an embodiment of the present disclosure, the generator includes a first lower electrode, a first piezoelectric material, and a first upper electrode which are sequentially stacked in a direction away from the substrate. In an embodiment of the present disclosure, the receiver includes a second lower electrode, a second piezoelectric material, and a second upper electrode which are sequentially stacked in a direction away from the substrate.

In an embodiment of the present disclosure, the first lower electrode is disposed in the same layer as the second lower electrode, and the first upper electrode is disposed in the same layer as the second upper electrode.

In an embodiment of the present disclosure, the first piezoelectric material is disposed in the same layer as the second piezoelectric material.

In an embodiment of the present disclosure, a cross-sectional shape of the generator and the receiver parallel to a surface of the substrate includes a square, a circle, a triangle, or a rhombus.

In an embodiment of the present disclosure, the pixel includes a light emitting device. The light emitting device includes an anode, a light emitting layer, and a cathode which are sequentially disposed in a direction perpendicular to the substrate. The anode is disposed in the same layer as the first lower electrode and the second lower electrode. The cathode covers the pixel definition layer and the light emitting layer.

In an embodiment of the present disclosure, the display substrate further includes a TFT layer located between the substrate and the light emitting device and located between the substrate and the pixel definition layer, a planarization layer located between the TFT layer and the light emitting device and located between the TFT layer and the pixel definition layer, an encapsulation layer located on the cathode, and a touch layer located on the encapsulation layer.

One aspect of the present disclosure provides a display device including a display substrate as described above.

One aspect of the present disclosure provides a method for manufacturing a display substrate. The method includes providing a substrate, forming a pixel definition layer for defining pixels on the substrate, and forming the pixels on the substrate and in the pixel definition layer. The pixel definition layer includes a plurality of inter-pixel portions located between adjacent pixels. In an embodiment of the present disclosure, forming the pixel definition layer includes forming a fingerprint recognition sensor in at least one of the inter-pixel portions.

In an embodiment of the present disclosure, the fingerprint recognition sensor is an ultrasonic fingerprint recognition sensor, and the ultrasonic fingerprint recognition sensor includes a generator and a receiver. Forming the ultrasonic fingerprint recognition sensor includes positioning the generator and the receiver in different inter-pixel portions or positioning the generator and the receiver in a same inter-pixel portion.

In an embodiment of the present disclosure, forming the ultrasonic fingerprint recognition sensor includes positioning the generator and the receiver in different inter-pixel portions. The inter-pixel portion includes a first inter-pixel portion and a second inter-pixel portion. In an embodiment of the present disclosure, forming the first inter-pixel portion, the second inter-pixel portion, and the ultrasonic fingerprint recognition sensor includes forming a first lower electrode in a region for forming the first inter-pixel portion on the substrate, and forming a second lower electrode in a region for forming the second inter-pixel portion on the substrate, forming a first portion of the first inter-pixel portion covering the substrate and the first lower electrode in the region for forming the first inter-pixel portion, and forming a first portion of the second inter-pixel portion covering the substrate and the second lower electrode in the region for forming the second inter-pixel portion, forming a first hole exposing the first lower electrode in the first portion of the first inter-pixel portion, and forming a second hole exposing the second lower electrode in the first portion of the second inter-pixel portion, forming a first piezoelectric material in the first hole, and forming a second piezoelectric material in the second hole, forming a first upper electrode on the first portion of the first inter-pixel portion and the first piezoelectric material, and forming a second upper electrode on the first portion of the second inter-pixel portion and the second piezoelectric material, and forming a second portion of the first inter-pixel portion on the first upper electrode and the first portion of the first inter-pixel portion, and forming a second portion of the second inter-pixel portion on the second upper electrode and the first portion of the second inter-pixel portion.

In an embodiment of the present disclosure, forming the first lower electrode and the second lower electrode includes forming a first conductive layer on the substrate, and patterning the first conductive layer to form the first lower electrode in the region for forming the first inter-pixel portion and form the second lower electrode in the region for forming the second inter-pixel portion. In an embodiment of the present disclosure, forming the first upper electrode and the second upper electrode includes forming a second conductive layer covering the first portion of the first inter-pixel portion and the first piezoelectric material and covering the first portion of the second inter-pixel portion and the second piezoelectric material, and patterning the second conductive layer to form the first upper electrode on the first portion of the first inter-pixel portion and the first piezoelectric material and form the second upper electrode on the first portion of the second inter-pixel portion and the second piezoelectric material.

In an embodiment of the present disclosure, forming the ultrasonic fingerprint recognition sensor includes positioning the generator and the receiver in the same inter-pixel portion. Forming the ultrasonic fingerprint recognition sensor includes forming a first lower electrode and a second lower electrode in a region for forming the inter-pixel portion on the substrate, forming a first portion of the inter-pixel portion covering the substrate, the first lower electrode, and the second lower electrode in the region for forming the inter-pixel portion, forming a first hole exposing the first lower electrode and a second hole exposing the second lower electrode in the first portion of the inter-pixel portion, forming a first piezoelectric material in the first hole, and forming a second piezoelectric material in the second hole, forming a first upper electrode on the first portion of the inter-pixel portion and the first piezoelectric material, and forming a second upper electrode on the first portion of the inter-pixel portion and the second piezoelectric material, and forming a second portion of the inter-pixel portion on the first portion of the inter-pixel portion, the first upper electrode, and the second upper electrode.

In an embodiment of the present disclosure, forming the first lower electrode and the second lower electrode includes forming a first conductive layer on the substrate, and patterning the first conductive layer to form the first lower electrode and the second lower electrode in the region for forming the inter-pixel portion. In an embodiment of the present disclosure, forming the first upper electrode and the second upper electrode includes forming a second conductive layer covering the first portion of the inter-pixel portion, the first piezoelectric material and the second piezoelectric material, and patterning the second conductive layer to form the first upper electrode on the first portion of the inter-pixel portion and the first piezoelectric material and form the second upper electrode on the first portion of the inter-pixel portion and the second piezoelectric material.

In an embodiment of the present disclosure, the pixel includes a light emitting device. Forming the light emitting device includes forming an anode on the substrate, wherein the anode is formed simultaneously with the first lower electrode and the second lower electrode, forming the light emitting layer on the anode, and forming a cathode on the light emitting layer and the pixel definition layer.

In an embodiment of the present disclosure, the method further includes forming a TFT layer on the substrate before forming the pixel definition layer and the fingerprint recognition sensor, and forming a planarization layer on the TFT layer, forming an encapsulation layer on the cathode after forming the cathode, and forming a touch layer on the encapsulation layer.

Adaptive and further aspects and scope will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several views of the drawings.

DETAILED DESCRIPTION

Figure 1:
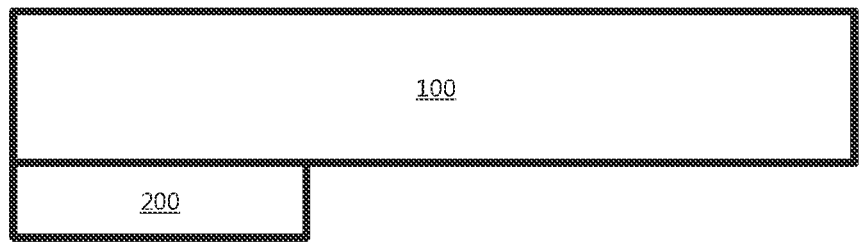
FIG. 1 is a schematic diagram showing a positional relationship between a display substrate and a fingerprint recognition sensor.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. The term "example" used herein, particularly when followed by a listing of terms, is merely exemplary and illustrative and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

In addition, in the drawings, the thickness of each layer and the region where each layer positioned are exaggerated for clarity. It should be understood that when referring to a layer, a region, or a component being located "on" another part, it means that the layer, the region or the component is directly located on another part, or there may be other components located between the layer, the region or the component and another part. In contrast, when a component is referred to as being "directly" located on another component, it means that no other component is located between them.

The flowchart depicted in present disclosure is only an example. There may be many variations to this flowchart or the steps described therein without departing from the spirit of the present disclosure. For example, the depicted steps may be performed in a different order, or steps may be added, deleted, or modified. These variations are considered as part of the claimed aspect.

Exemplary embodiments will now be described more fully with reference to the accompanying drawings.

Currently, there are three main technologies for fingerprint recognition applied to smart phones: capacitive, optical, and ultrasonic technologies. At present, the most mature fingerprint mobile phones on the market are basically capacitive. However, with the launch of full-screen phones, the location of the capacitive sensor needs to be designed to avoid occupying the area of the body of the mobile phone. In addition, because the optical and ultrasonic sensors can be directly attached to the lower part of back of the display, and thus no more restrictions will be applied to the appearance of the mobile phone, major mobile phone manufacturers and scientific research institutions actively carry out technical research on it.

Ultrasonic fingerprint recognition technology refers to perform fingerprint recognition by employing ultrasonic waves to scan fingerprint. Compared with capacitive touch screen fingerprint technology, ultrasonic fingerprint technology has many unique advantages including the ability to scan through a smartphone case made of glass, stainless steel, sapphire, or plastic and overcome the problem that fingerprints cannot unlock mobile phone due to sweat, oil, and dirt, thereby providing a more stable and accurate authentication method. In addition, ultrasonic waves can penetrate directly through the skin surface, so as to recognize three-dimensional details and unique fingerprint features including fingerprint ridges and sweat pores that cannot be recognized by current capacitive touch screen based fingerprint technology. Thus, fingerprint surface maps which are rich in detail and difficult to imitate can be generated. However, the current ultrasonic fingerprint recognition module needs to be attached to the lower part of back of the display, which will increase cost including module equipment, labor, time, etc. Therefore, while developing the ultrasonic fingerprint recognition technology, it is also necessary to develop the manufacturing process for mass production about the technology.

FIG. 1 is a schematic diagram of a positional relationship between a display substrate and a fingerprint recognition sensor. As shown in FIG. 1, the fingerprint recognition sensor 200 is located outside the display substrate 100, that is, the fingerprint recognition sensor 200 is attached to the outside of the display substrate 100. Such structure requires additional fitting equipment, and thus increased costs about labor, time, etc.

Figure 2:
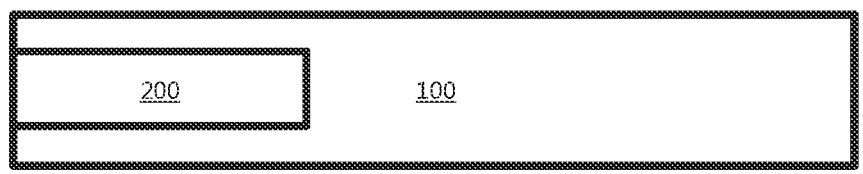
FIG. 2 is a schematic diagram showing a positional relationship between a display substrate and a fingerprint recognition sensor according to an embodiment of the present disclosure.

FIG. 2 is a schematic diagram of a positional relationship between a display substrate and a fingerprint recognition sensor according to an embodiment of the present disclosure. As shown in FIG. 2, the fingerprint recognition sensor 200 is integrated within the display substrate 100, which can reduce the process of attaching the fingerprint recognition sensor to the display substrate, thereby improving productivity, simplifying manufacturing processes, and saving costs.

Figure 3:
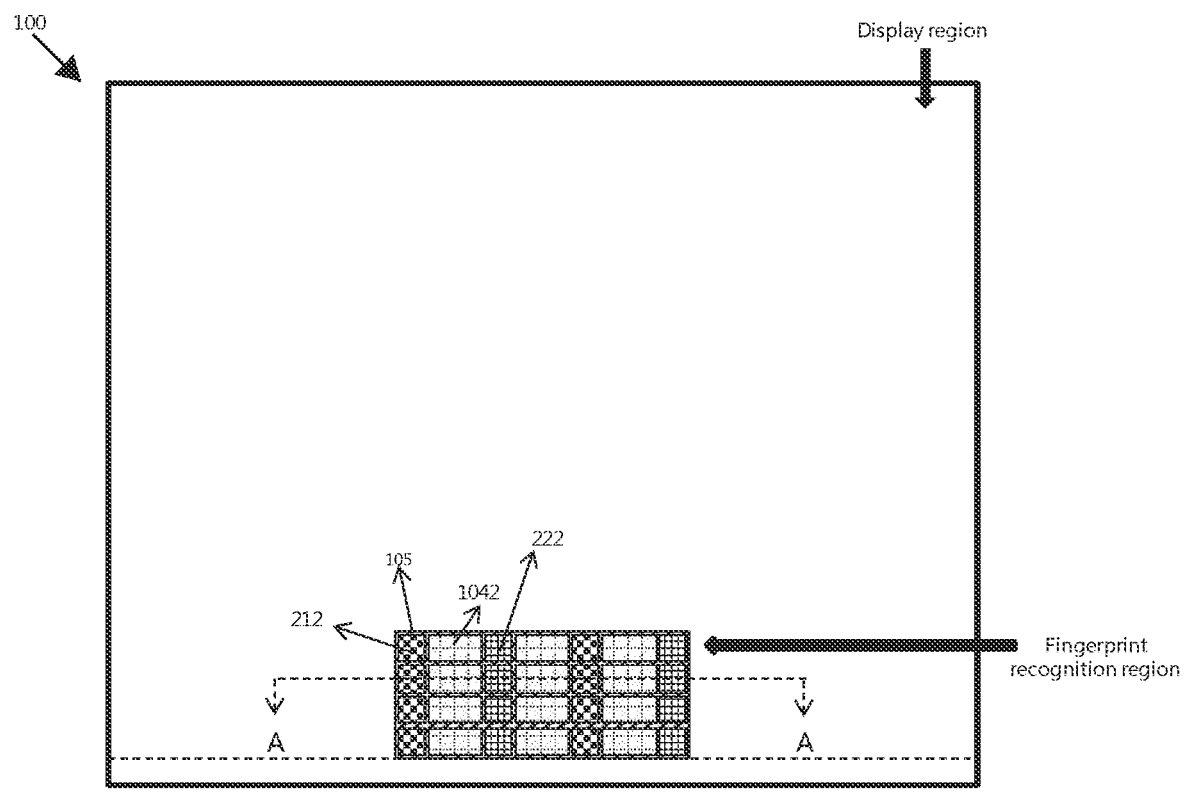
FIG. 3 is a schematic plan view of a display substrate according to an embodiment of the present disclosure.
Figure 4:
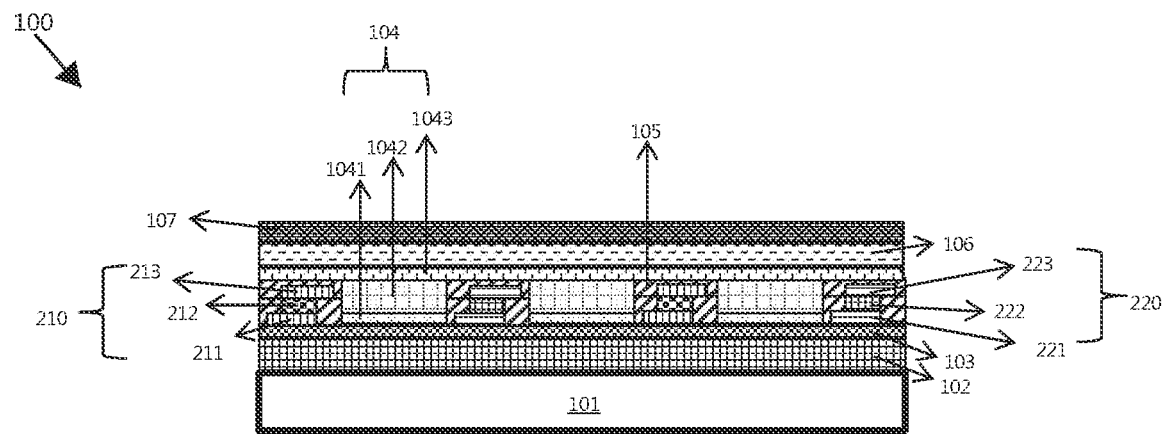
FIG. 4 is a schematic cross-sectional view of a display substrate according to an embodiment of the present disclosure.
Figure 5:
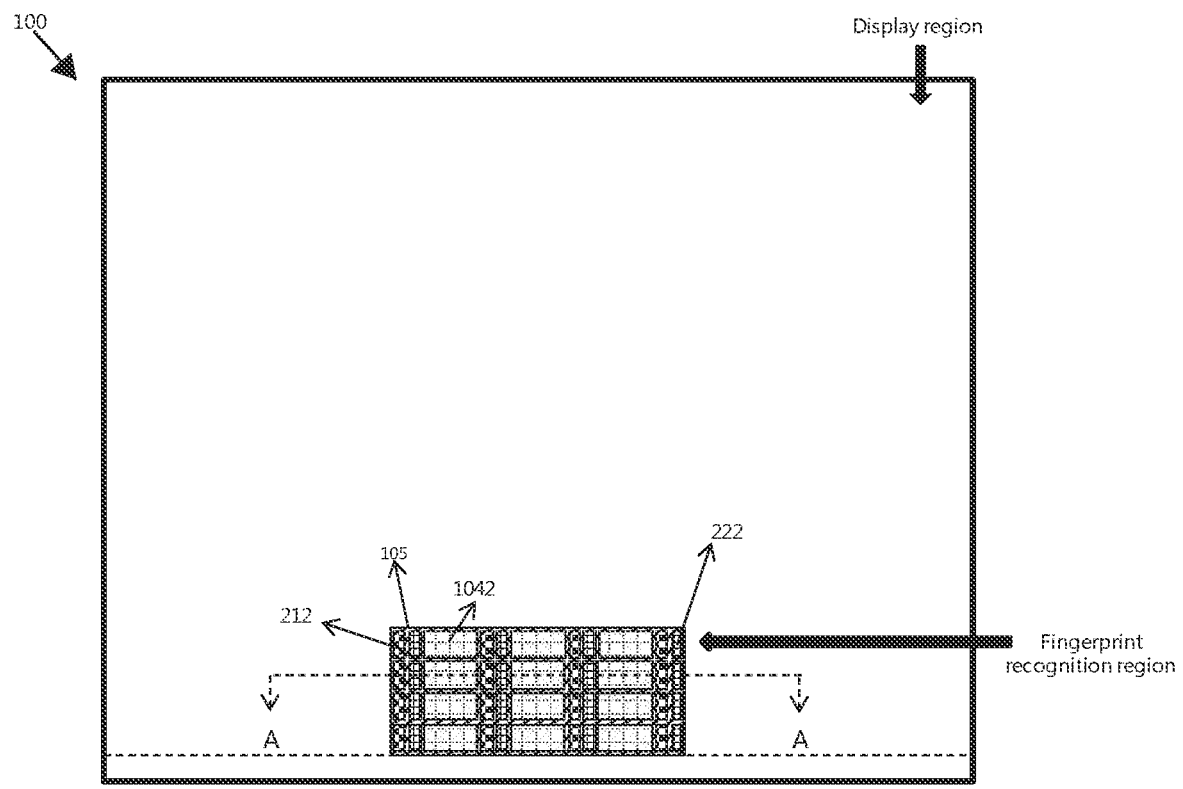
FIG. 5 is a schematic plan view of a display substrate according to an embodiment of the present disclosure.
Figure 6:
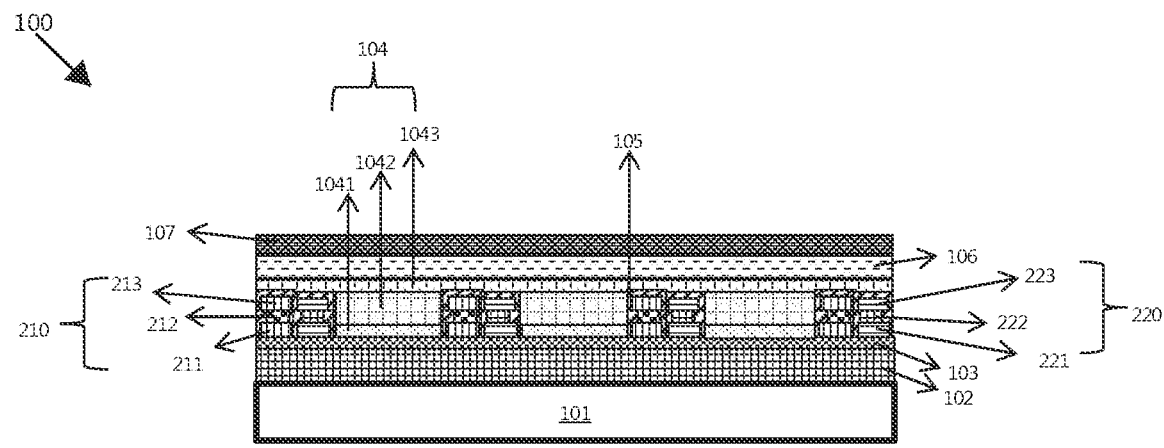
FIG. 6 is a schematic cross-sectional view of a display substrate according to an embodiment of the present disclosure.

FIG. 3 is a schematic plan view of a display substrate according to an embodiment of the present disclosure. FIG. 4 is a schematic cross-sectional view of a display substrate taken along a line AA according to an embodiment of the present disclosure. FIG. 5 is a schematic plan view of a display substrate according to an embodiment of the present disclosure. FIG. 6 is a schematic cross-sectional view of a display substrate taken along a line AA according to an embodiment of the present disclosure. It should be noted that the fingerprint recognition region shown in FIG. 3 and FIG. 5 is located within the display region of the display substrate 100. However, the position of the fingerprint recognition region shown in FIG. 3 and FIG. 5 is only exemplary and should not be considered as a limitation to the present disclosure, and those skilled in the art may choose position of the fingerprint recognition region according to actual needs.

In an embodiment of the present disclosure, as shown in FIGS. 4 and 6, the display substrate 100 includes a substrate 101, a pixel definition layer 105 for defining pixels 104 on the substrate 101, wherein the pixel definition layer 105 includes a plurality of inter-pixel portions 105 located between adjacent pixels 104, and a fingerprint recognition sensor located in the inter-pixel portion 105. The pixel definition layer can be formed, for example, as a mesh structure with multiple openings. The inter-pixel portion can be, for example, a solid portion between openings. The opening is used to form a pixel. One inter-pixel portion can be, for example, an integral of the solid part between two adjacent pixels. The pixel definition layer can be formed, for example, as an accommodating space surrounded by dams. The accommodating space can be used to form pixels, for example. The inter-pixel portion can be the dam structure. One inter-pixel portion can be, for example, an integral of the dam structure between two pixels. The pixel may include, for example, a light emitting device. Since the fingerprint recognition sensor is integrated in the pixel definition layer, it does not affect the display of the display substrate. In addition, it should be noted that, in the display region of the display substrate, the thickness of the inter-pixel portion provided with the fingerprint recognition sensor and the thickness of the inter-pixel portion provided without the fingerprint recognition sensor may be the same, so as to not affect the subsequent structure.

In an embodiment of the present disclosure, the fingerprint recognition sensor is an ultrasonic fingerprint recognition sensor. In an embodiment of the present disclosure, as shown in FIGS. 4 and 6, the ultrasonic fingerprint recognition sensor includes a generator 210 and a receiver 220.

On one hand, in an embodiment of the present disclosure, as shown in FIGS. 3 and 4, the generator 210 and the receiver 220 are located in different inter-pixel portions 105, respectively. The different inter-pixel portions may be, for example, inter-pixel portions on different sides of the same pixel. The different inter-pixel portions may be, for example, inter-pixel portions on the same side of different pixels. On the other hand, in an embodiment of the present disclosure, as shown in FIGS. 5 and 6, the generator 210 and the receiver 220 may also be located in the same inter-pixel portion 105. The same inter-pixel portion may be, for example, an inter-pixel portion between two adjacent pixels. For example, the two adjacent pixels may be in an arrangement direction of the two adjacent pixels. There are no other pixels between the two adjacent pixels. For example, two adjacent pixels and the inter-pixel portion may be an integral and there is no opening between the two adjacent pixels. The generator and the receiver may, for example, be arranged along the arrangement direction of the two adjacent pixels, or may be arranged along a direction perpendicular to the arrangement direction of the two adjacent pixels.

Specifically, as shown in FIGS. 4 and 6, the generator 210 includes a first lower electrode 211, a first piezoelectric material 212, and a first upper electrode 213 which are sequentially stacked in a direction away from the substrate 101. The receiver 220 includes a second lower electrode 221, a second piezoelectric material 222, and a second upper electrode 223 which are sequentially stacked in a direction away from the substrate 101.

In an embodiment of the present disclosure, the first lower electrode 211 is disposed in the same layer as the second lower electrode 221, and the first upper electrode 213 is disposed in the same layer as the second upper electrode 223. Here, the "being disposed in the same layer" means that they are formed of the same material layer.

In an embodiment of the present disclosure, the first piezoelectric material 212 is disposed in the same layer as the second piezoelectric material 222. It should be noted that the first piezoelectric material 212 and the second piezoelectric material 222 may also be formed of different piezoelectric materials, and those skilled in the art may choose the piezoelectric material according to actual needs.

In an embodiment of the present disclosure, the first piezoelectric material 212 and the second piezoelectric material 222 may include an organic material, an inorganic material, a semiconductor material, or a combination thereof.

In an exemplary embodiment of the present disclosure, the organic material may include polyvinylidene fluoride (Ethene, 1,1-difluoro-, homopolymer, or PVDF), polyvinyl fluoride (PVF), or polyvinyl chloride (PVC).

In an exemplary embodiment of the present disclosure, the inorganic material may include quartz or piezoelectric ceramic.

In an exemplary embodiment of the present disclosure, the semiconductor material may include ZnS, CdTe, or GaAs.

As an example, the first piezoelectric material 212 and the second piezoelectric material 222 can be obtained by dissolving polyvinylidene fluoride in N, N-dimethylformamide (DMF) or N-methyl pyrrolidone (NMP) to form a solution, followed by processes including coating the solution, baking, annealing, etc.

As another example, the first piezoelectric material 212 and the second piezoelectric material 222 may be a composite piezoelectric material including polyvinylidene fluoride and lead zirconate titanate piezoelectric ceramic transducer (PZT), so as to obtain more excellent piezoelectric performance.

In an embodiment of the present disclosure, the cross-sectional shape of the generator 210 and the receiver 220 parallel to the surface of the substrate 101 include a square, a circle, a triangle, or a rhombus.

In an embodiment of the present disclosure, as shown in FIGS. 4 and 6, the pixel 104 includes a light emitting device 104. The light emitting device 104 includes an anode 1041, a light emitting layer 1042, and a cathode 1043 which are sequentially disposed in a direction perpendicular to the substrate 101. The cathode 1043 covers the pixel definition layer 105 and the light emitting layer 1042.

In an embodiment of the present disclosure, the anode 1041 is disposed in the same layer as the first lower electrode 211 and the second lower electrode 221.

In an embodiment of the present disclosure, as shown in FIGS. 4 and 6, the display substrate 100 further includes a TFT layer 102 located between the substrate 101 and the light emitting device 104 and located between the substrate 101 and the pixel definition layer 105, a planarization layer 103 located between the TFT layer 102 and the light emitting device 104 and located between the TFT layer 102 and the pixel definition layer 105, an encapsulation layer 106 located on the cathode 1043, and a touch layer 107 located on the encapsulation layer 106. It should be noted that, in the case where the light emitting layer 1042 emits white light, the touch layer 107 further includes a color film layer, so that the display substrate 100 can implement color display.

In an exemplary embodiment of the present disclosure, the light emitting device 104 may be an OLED light emitting device or a QLED light emitting device.

In an exemplary embodiment of the present disclosure, the TFT layer 102 may include a low temperature poly-silicon (LTPS) layer, an indium gallium zinc oxide (IGZO) layer, or an a-Si layer.

In an embodiment of the present disclosure, the substrate 101 may be a flexible substrate or a rigid substrate. In an exemplary embodiment of the present disclosure, the rigid substrate may include glass, plastic, or metal.

In an embodiment of the present disclosure, a display device is also provided. The display device includes the display substrate as described above.

In an embodiment of the present disclosure, a method for manufacturing a display substrate is also provided. The display substrate manufactured by this method is shown in FIGS. 4 and 6.

Figure 7:
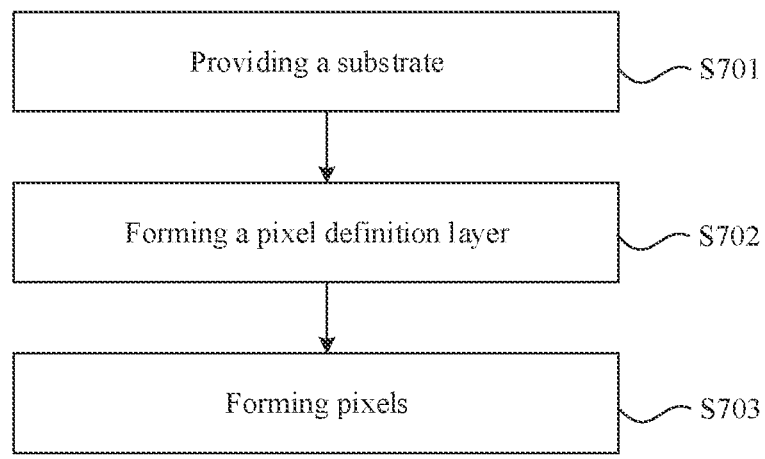
FIG. 7 is a flowchart of a method for manufacturing a display substrate according to an embodiment of the present disclosure.

FIG. 7 is a flowchart of a method for manufacturing a display substrate according to an embodiment of the present disclosure. As shown in FIG. 7, the method includes steps S701 to S703. In step S701, a substrate is provided; in step S702, a pixel definition layer for defining pixels is formed on the substrate; and in step S703, pixels are formed on the substrate and in the pixel definition layer. In an embodiment of the present disclosure, the pixel definition layer includes a plurality of inter-pixel portions located between adjacent pixels.

In an embodiment of the present disclosure, forming a pixel definition layer includes forming a fingerprint recognition sensor in the inter-pixel portion.

In an embodiment of the present disclosure, the fingerprint recognition sensor is an ultrasonic fingerprint recognition sensor. The ultrasonic fingerprint recognition sensor includes a generator and a receiver.

In one aspect, in an embodiment of the present disclosure, forming an ultrasonic fingerprint recognition sensor includes positioning the generator and the receiver in different inter-pixel portions. In this embodiment, the manufactured display substrate is shown in FIG. 4.

Next, a method for forming the inter-pixel portion and the ultrasonic fingerprint recognition sensor so as to position the generator and the receiver in different inter-pixel portions will be described in detail with reference to FIGS. 8A to 12B.

In an embodiment of the present disclosure, the inter-pixel portion may include a first inter-pixel portion 1051 and a second inter-pixel portion 1052.

Figure 8A:
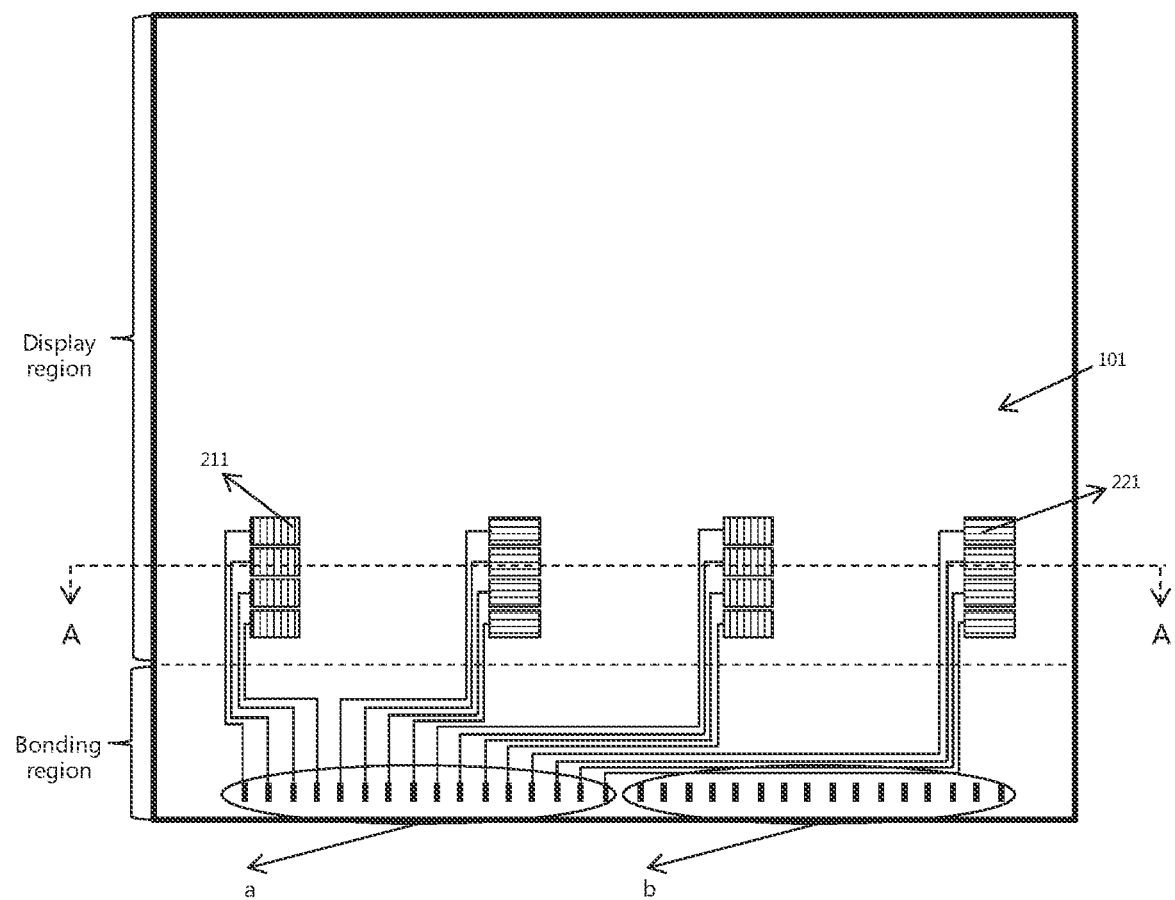
FIGS. 8A to 17B are schematic plan and cross-sectional views of a method for manufacturing a display substrate according to an embodiment of the present disclosure.
Figure 8B:
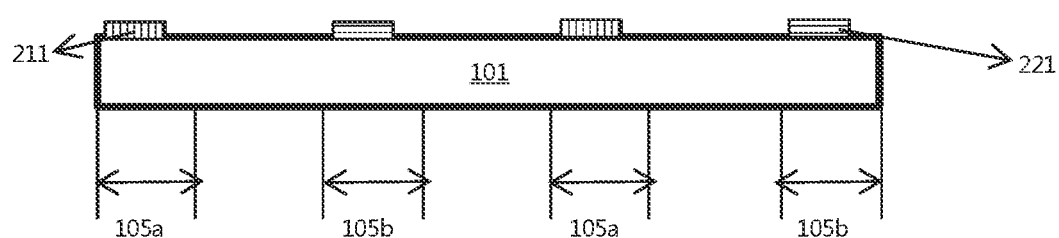

FIG. 8A is a schematic plan view of a method for manufacturing a display substrate according to an embodiment of the present disclosure. FIG. 8B is a schematic cross-sectional view taken along the line AA in FIG. 8A.

As shown in FIGS. 8A and 8B, a first lower electrode 211 is formed in a region 105a for forming the first inter-pixel portion on a substrate 101, and a second lower electrode 221 is formed in a region 105b for forming the second inter-pixel portion on the substrate 101.

Specifically, forming the first lower electrode 211 and the second lower electrode 221 includes forming a first conductive layer (not shown) on the substrate 101, and patterning the first conductive layer to form the first lower electrode 211 in the region 105a for forming the first inter-pixel portion and form the second lower electrode 221 in the region 105b for forming the second inter-pixel portion.

It should be noted that, as shown in FIG. 8A, wirings and pad a for the first lower electrode 211 and the second lower electrode 221 are also formed in the bonding region of the substrate 101 at the same time as the first lower electrode 211 and the second lower electrode 221 are formed. In addition, in an embodiment of the present disclosure, pads b for the first upper electrode 213 and the second upper electrode 223 (to be described later) corresponding to the first lower electrode 211 and the second lower electrode 221 are formed at the same time as the pads a are formed. It should be noted that the design of the wiring in the bonding region of the present disclosure is only exemplary and should not be considered as a limit to the present disclosure, and those skilled in the art may design it according to actual needs.

In an embodiment of the present disclosure, the bonding region is used for bonding a corresponding flexible printed circuit (FPC) board or a chip on film (COF). Specifically, the pads a and b in the bonding region are used to bond the corresponding FPC and COF. The pads a and b may be generally referred to "gold fingers".

Figure 9A:
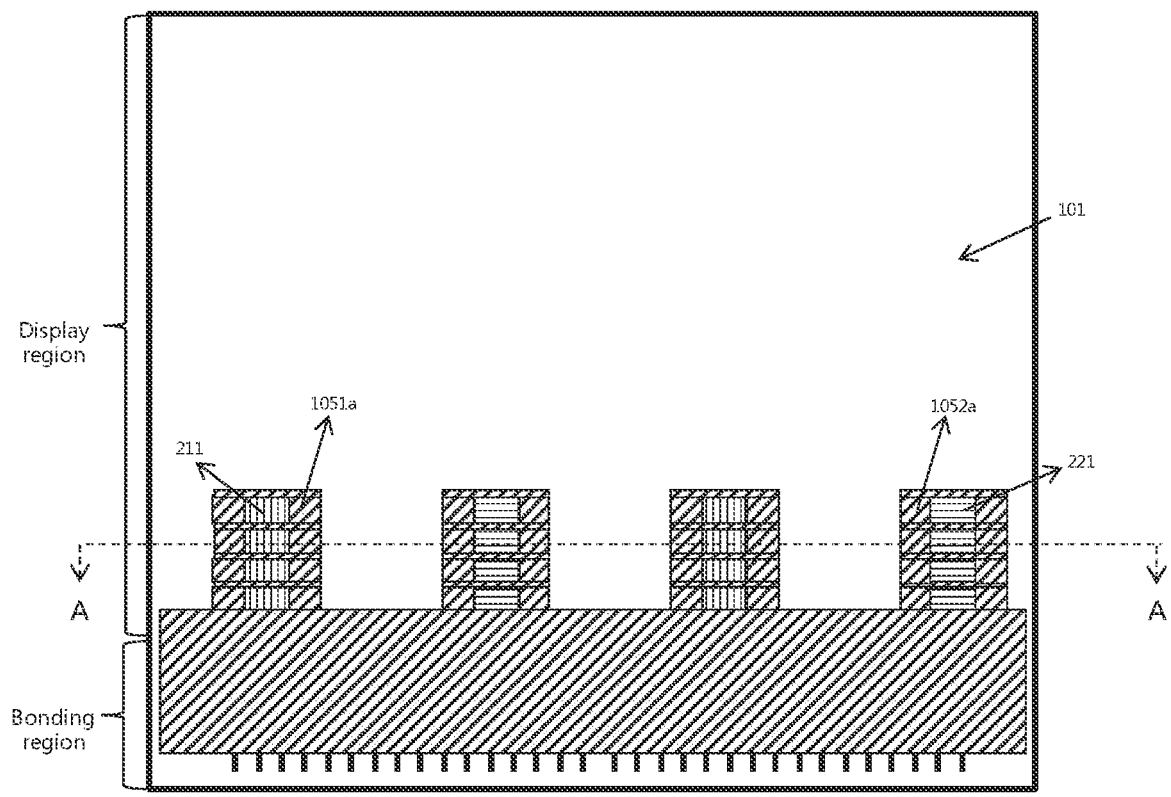
Figure 9B:
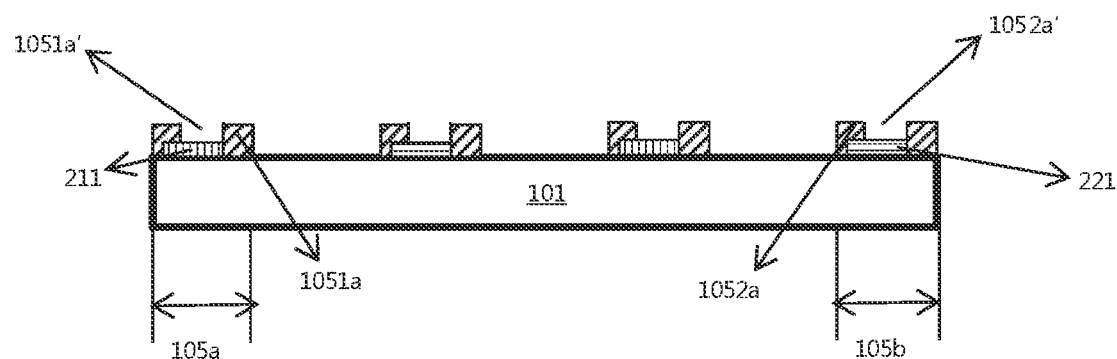

FIG. 9A is a schematic plan view of a method for manufacturing a display substrate according to an embodiment of the present disclosure. FIG. 9B is a schematic cross-sectional view taken along the line AA in FIG. 9A.

As shown in FIGS. 9A and 9B, a first portion 1051a of the first inter-pixel portion covering the substrate 101 and the first lower electrode 211 is formed in the region 105a for forming the first inter-pixel portion, and a first portion 1052a of the second inter-pixel portion covering the substrate 101 and the second lower electrode 221 is formed in the region 105b for forming the second inter-pixel portion. A first hole 1051a' exposing the first lower electrode 211 is formed in the first portion 1051a of the first inter-pixel portion, and a second hole 1052a' exposing the second lower electrode 221 is formed in the first portion 1052a of the second inter-pixel portion.

In an embodiment of the present disclosure, the first hole 1051a' and the second hole 1052a' may be formed using a patterning process including exposure, development, etc.

In an embodiment of the present disclosure, the first portion 1051a of the first inter-pixel portion and the first portion 1052a of the second inter-pixel portion also cover the wiring in the bonding region, thereby avoiding being connected to subsequently formed wiring for the first upper electrode 213 and the second upper electrodes 223 (to be described later).

Figure 10A:
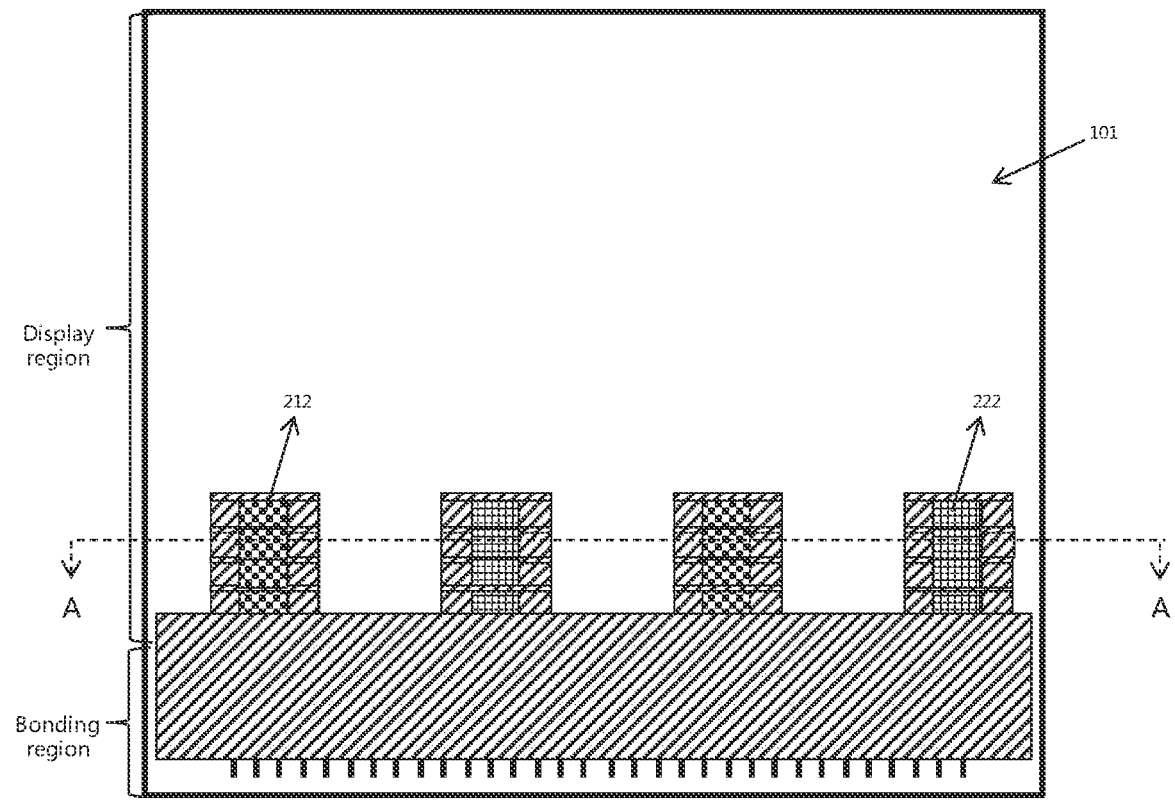
Figure 10B:
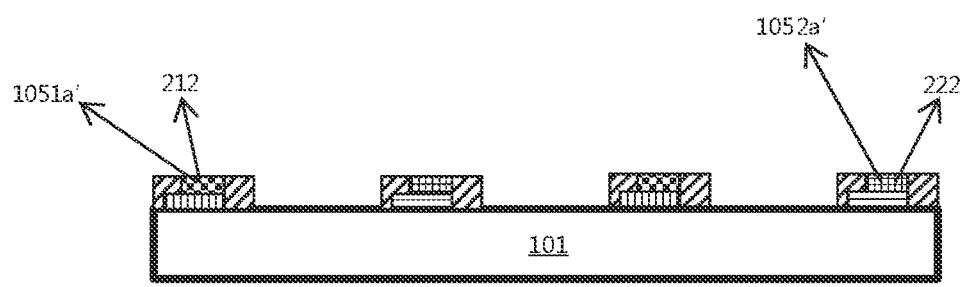

FIG. 10A is a schematic plan view of a method for manufacturing a display substrate according to an embodiment of the present disclosure. FIG. 10B is a schematic cross-sectional view taken along the line AA in FIG. 10A.

As shown in FIGS. 10A and 10B, a first piezoelectric material 212 is formed in the first hole 1051a', and a second piezoelectric material 222 is formed in the second hole 1052a'.

It should be noted that, for specific materials of the first piezoelectric material 212 and the second piezoelectric material 222, reference may be made to the above descriptions of FIGS. 4 and 6, and details are not described herein again.

As an example, the first piezoelectric material 212 and the second piezoelectric material 222 can be prepared by dissolving polyvinylidene fluoride in N, N-dimethylformamide or N-methylpyrrolidone to obtain a solution, coating the first hole 1051a' and the second hole 1052a' with this solution, annealing the structure thus obtained in an oven under the temperature of 30-80° C., thereby obtaining the first piezoelectric material 212 and the second piezoelectric material 222.

As another example, a lead zirconate titanate piezoelectric ceramic transducer may be added to the above solution, and other steps are the same as those in the above example, thereby obtaining the first piezoelectric material 212 and the second piezoelectric material 222 having a composite piezoelectric material, so as to achieve more excellent piezoelectric performance.

Figure 11A:
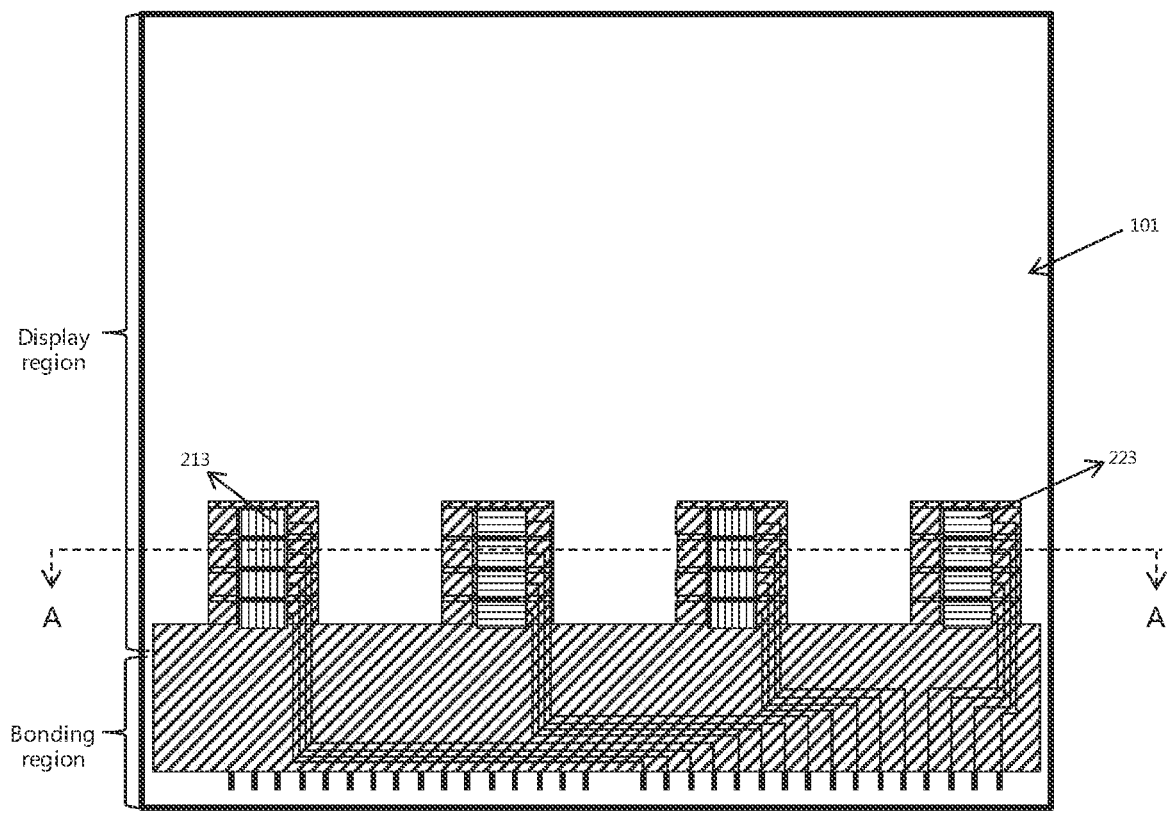
Figure 11B:
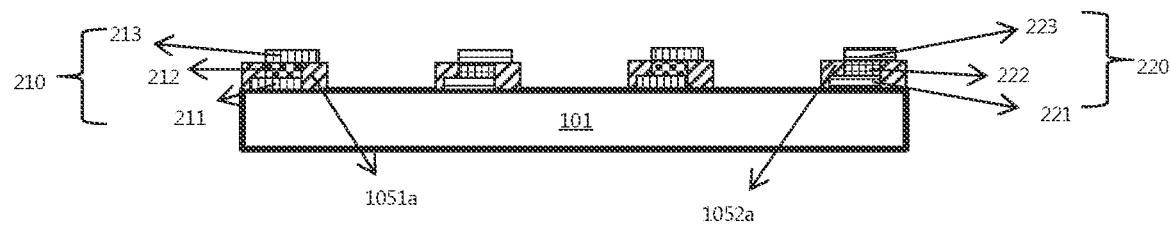

FIG. 11A is a schematic plan view of a method for manufacturing a display substrate according to an embodiment of the present disclosure. FIG. 11B is a schematic cross-sectional view taken along the line AA in FIG. 11A.

As shown in FIGS. 11A and 11B, a first upper electrode 213 is formed on the first portion 1051a of the first inter-pixel portion and the first piezoelectric material 212, and a second upper electrode 223 is formed on the first portion 1052a of the second inter-pixel portion and the second piezoelectric material 222.

Specifically, forming the first upper electrode 213 and the second upper electrode 223 includes forming a second conductive layer (not shown) covering the first portion 1051a of the first inter-pixel portion and the first piezoelectric material 212 and covering the first portion 1052a of the second inter-pixel portion and the second piezoelectric material 222, and patterning the second conductive layer to form the first upper electrode 213 on the first portion 1051a of the first inter-pixel portion and the first piezoelectric material 212 and form the second upper electrode 223 on the first portion 1052a of the second inter-pixel portion and the second piezoelectric material 222.

In an embodiment of the present disclosure, the first lower electrode 211, the first piezoelectric material 212, and the first upper electrode 213 constitute the generator 210 of the ultrasonic fingerprint recognition sensor. The second lower electrode 221, the second piezoelectric material 222, and the second upper electrode 223 constitute the receiver 220 of the ultrasonic fingerprint recognition sensor.

In an embodiment of the present disclosure, the first lower electrode 211, the second lower electrode 221, the first upper electrode 213, and the second upper electrode 223 may be prepared through processes such as sputtering, exposure, and etching, etc.

It should be noted that, as shown in FIG. 11A, wiring for the first upper electrode 213 and the second upper electrode 223 are also formed in the bonding region of the substrate 101 while the first upper electrode 213 and the second upper electrode 223 are formed. It should be noted that the design of wiring in the bonding region of the present disclosure is only exemplary and should not be considered as a limit to the present disclosure, and those skilled in the art may design it according to actual needs.

Figure 12A:
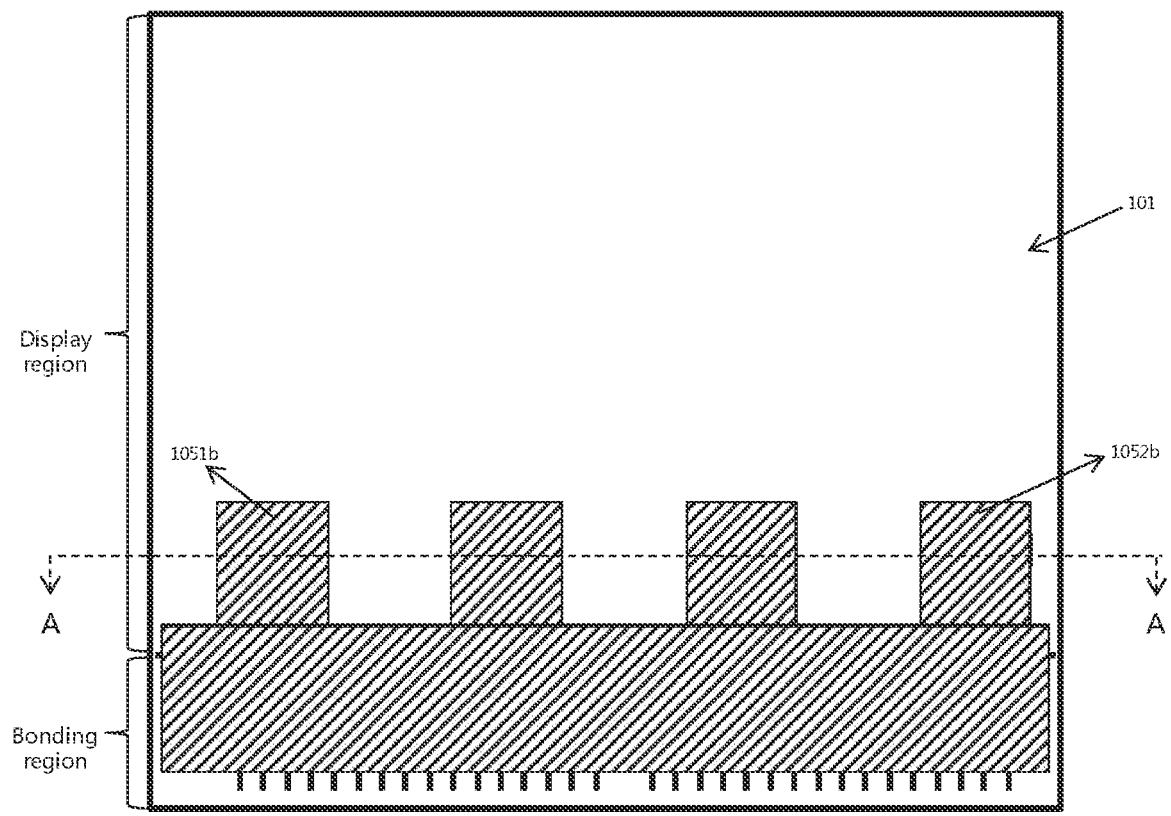
Figure 12B:
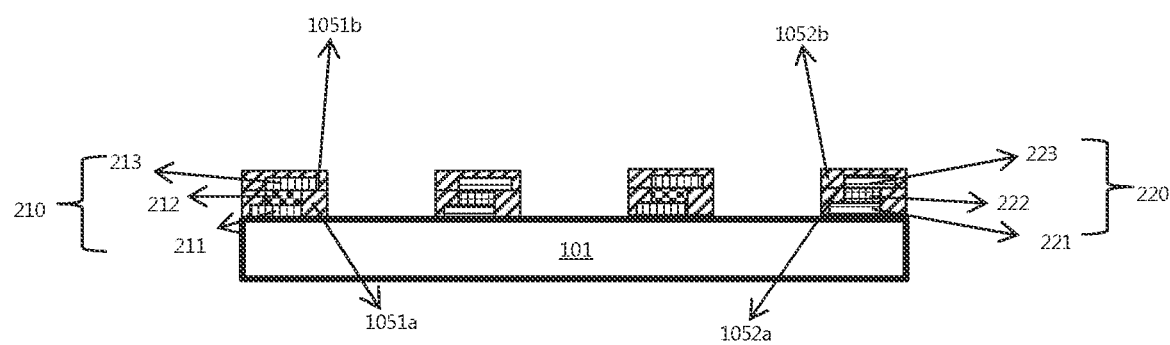

FIG. 12A is a schematic plan view of a method for manufacturing a display substrate according to an embodiment of the present disclosure. FIG. 12B is a schematic cross-sectional view taken along the line AA in FIG. 12A.

As shown in FIGS. 12A and 12B, a second portion 1051b of the first inter-pixel portion is formed on the first upper electrode 213 and the first portion 1051a of the first inter-pixel portion, and a second portion 1052b of the second inter-pixel portion is formed on the second upper electrode 223 and the first portion 1052a of the second inter-pixel portion.

In an embodiment of the present disclosure, the second portion 1051b of the first inter-pixel portion and the second portion 1052b of the second inter-pixel portion also cover the wiring in the bonding region.

On the other hand, in an embodiment of the present disclosure, forming the ultrasonic fingerprint recognition sensor includes positioning the generator and the receiver in the same inter-pixel portion. In this embodiment, the manufactured display substrate is shown in FIG. 6.

Next, a method for forming the inter-pixel portion and the ultrasonic fingerprint recognition sensor so as to position the generator and the receiver in the same inter-pixel portion will be described in detail with reference to FIGS. 13A to 17B.

Figure 13A:
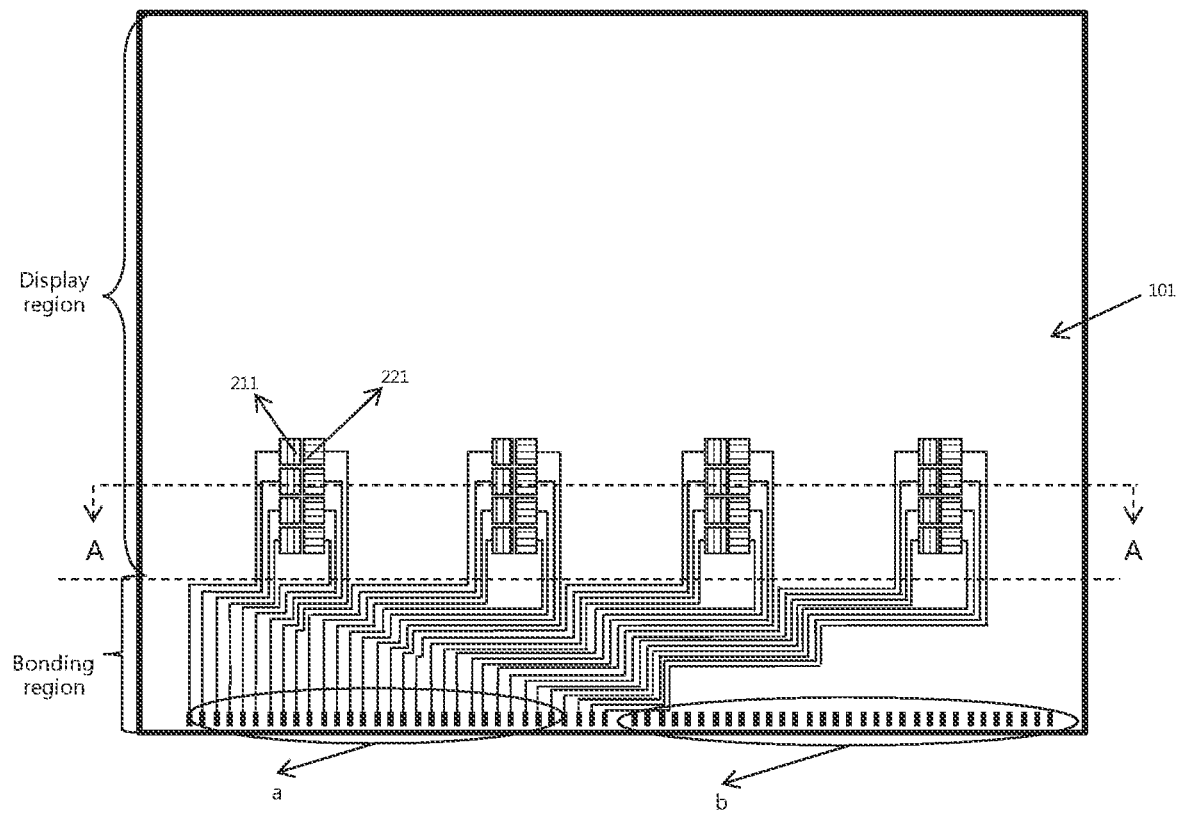
Figure 13B:
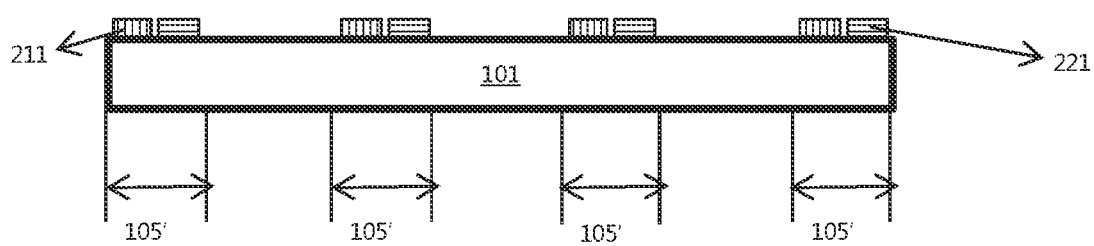

FIG. 13A is a schematic plan view of a method for manufacturing a display substrate according to an embodiment of the present disclosure. FIG. 13B is a schematic cross-sectional view taken along line AA in FIG. 13A.

As shown in FIGS. 13A and 13B, a first lower electrode 211 and a second lower electrode 221 are formed in a region 105' for forming the inter-pixel portion on a substrate 101.

Specifically, forming the first lower electrode 211 and the second lower electrode 221 includes forming a first conductive layer (not shown) on the substrate 101, and patterning the first conductive layer to form the first lower electrode 211 and the second lower electrode 221 in the region 105' for forming the inter-pixel portion.

It should be noted that, as shown in FIG. 13A, wirings and pad a for the first lower electrode 211 and the second lower electrode 221 are also formed in the bonding region of the substrate 101 at the same time as the first lower electrode 211 and the second lower electrode 221 are formed. In addition, in an embodiment of the present disclosure, pads b for the first upper electrode 213 and the second upper electrode 223 (to be described later) corresponding to the first lower electrode 211 and the second lower electrode 221 are formed at the same time as the pads a are formed. It should be noted that the design of the wiring in the bonding region of the present disclosure is only exemplary and should not be considered as a limit to the present disclosure, and those skilled in the art may design it according to actual needs.

In an embodiment of the present disclosure, the bonding region is used for bonding a corresponding flexible printed circuit board or a chip on film.

Figure 14A:
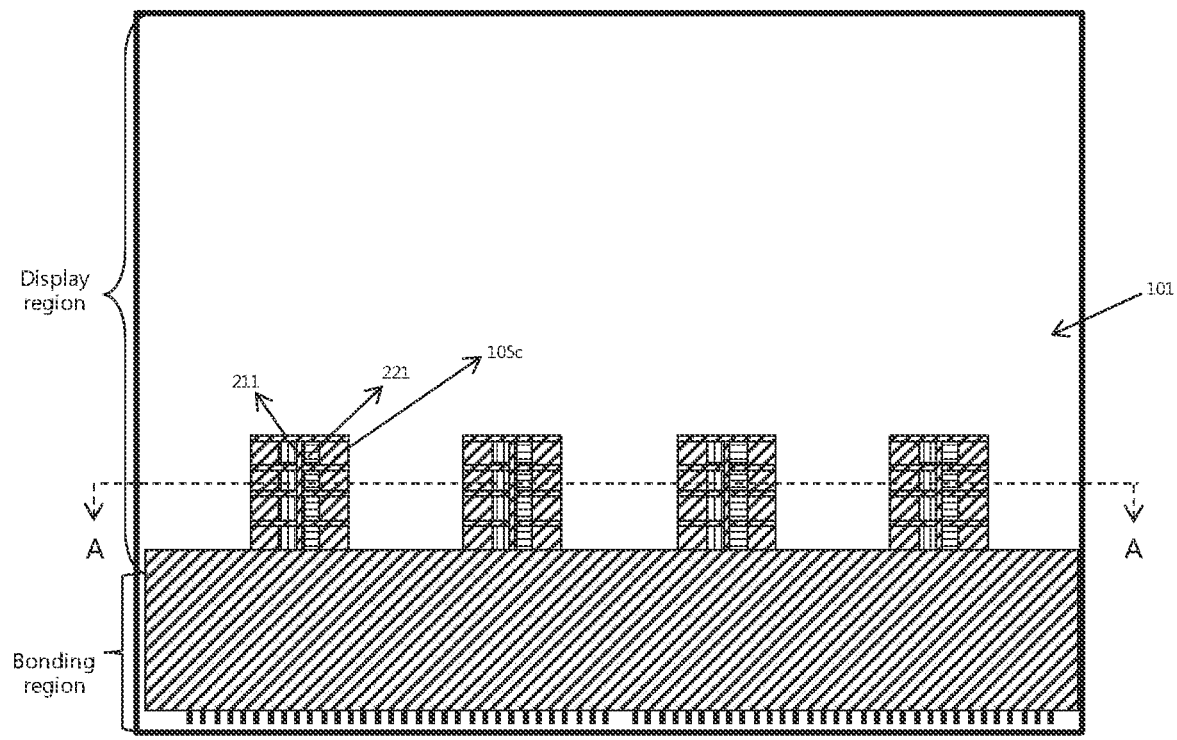
Figure 14B:
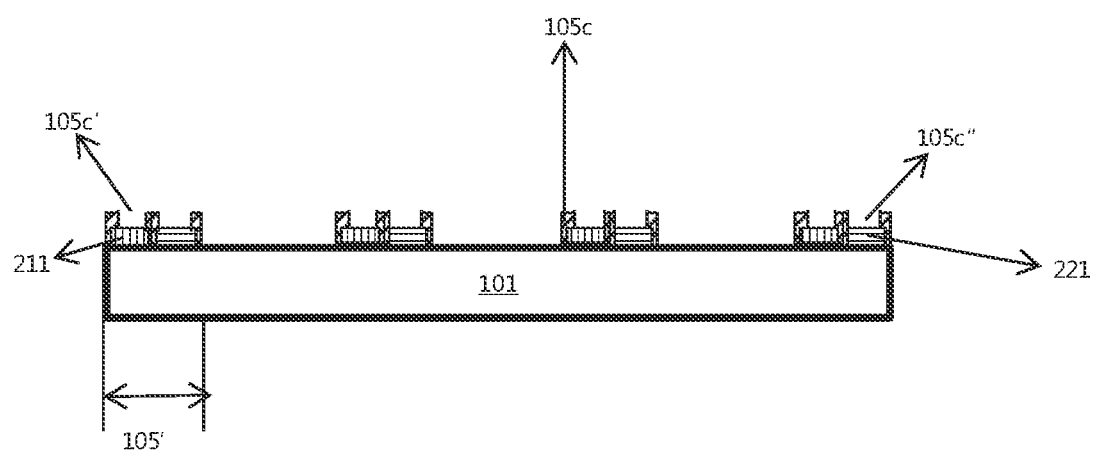

FIG. 14A is a schematic plan view of a method for manufacturing a display substrate according to an embodiment of the present disclosure. FIG. 14B is a schematic cross-sectional view taken along the line AA in FIG. 14A.

As shown in FIGS. 14A and 14B, a first portion 105c of the inter-pixel portion covering the substrate 101, the first lower electrode 211 and the second lower electrode 221 is formed in the region 105' for forming the inter-pixel portion. A first hole 105c' exposing the first lower electrode 211 and a second hole 105c" exposing the second lower electrode 221 are formed in the first portion 105c of the inter-pixel portion.

In an embodiment of the present disclosure, the first hole 105c' and the second hole 105c" may be formed using processes such as exposure, development, etc.

In an embodiment of the present disclosure, the first portion 105c of the inter-pixel portion also covers the wiring in the bonding region, thereby avoiding being connected to subsequently formed wiring for the first upper electrode 213 and the second upper electrodes 223 (to be described later).

Figure 15A:
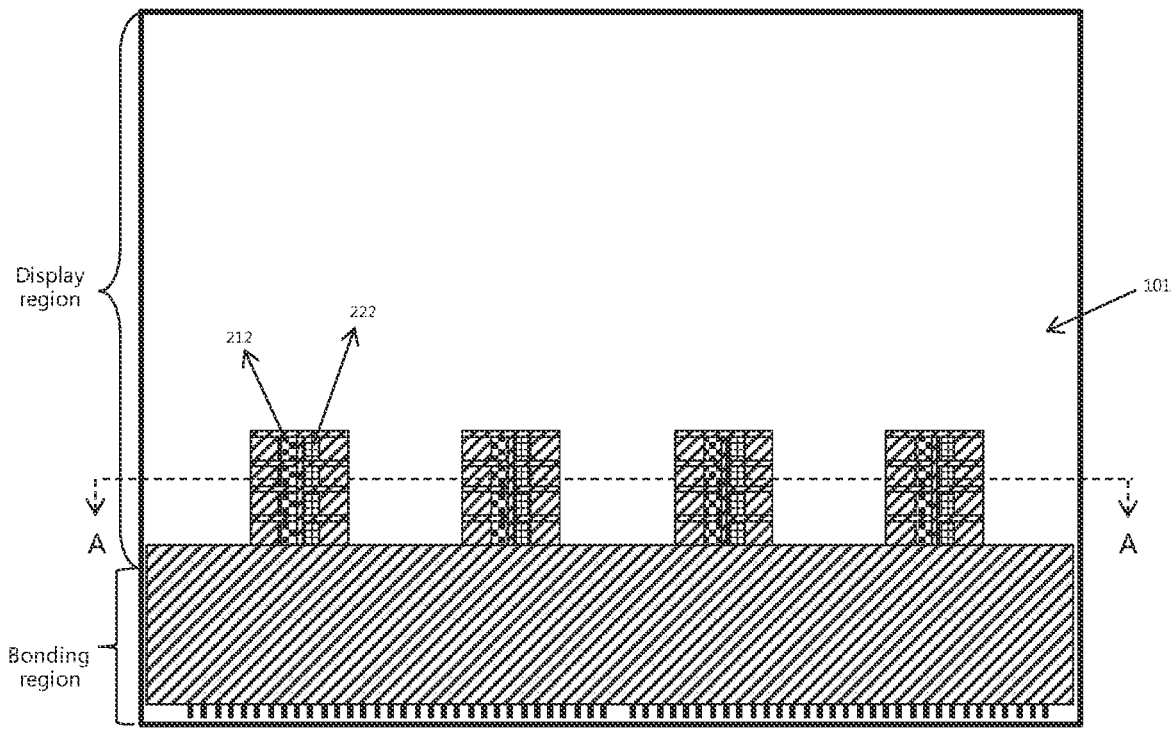
Figure 15B:
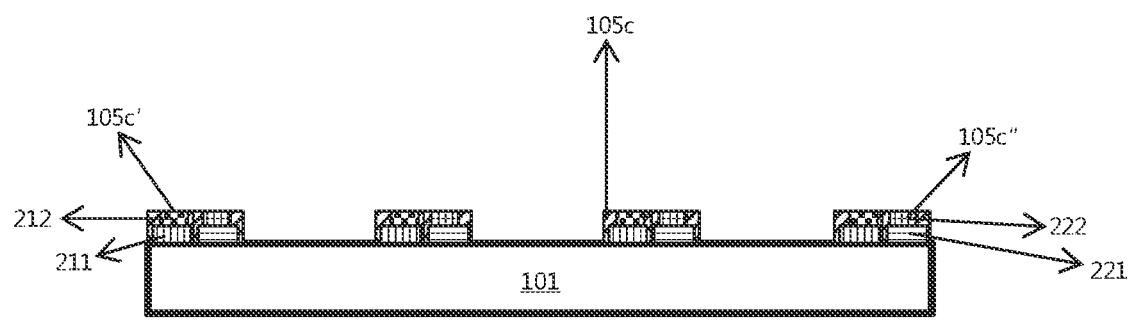

FIG. 15A is a schematic plan view of a method for manufacturing a display substrate according to an embodiment of the present disclosure. FIG. 15B is a schematic cross-sectional view taken along the line AA in FIG. 15A.

As shown in FIGS. 15A and 15B, a first piezoelectric material 212 is formed in the first hole 105c', and a second piezoelectric material 222 is formed in the second hole 105c".

For the detailed description of the first piezoelectric material 212 and the second piezoelectric material 222, reference may be made to the above descriptions of FIGS. 4 and 6 above, and details are not described herein again.

Figure 16A:
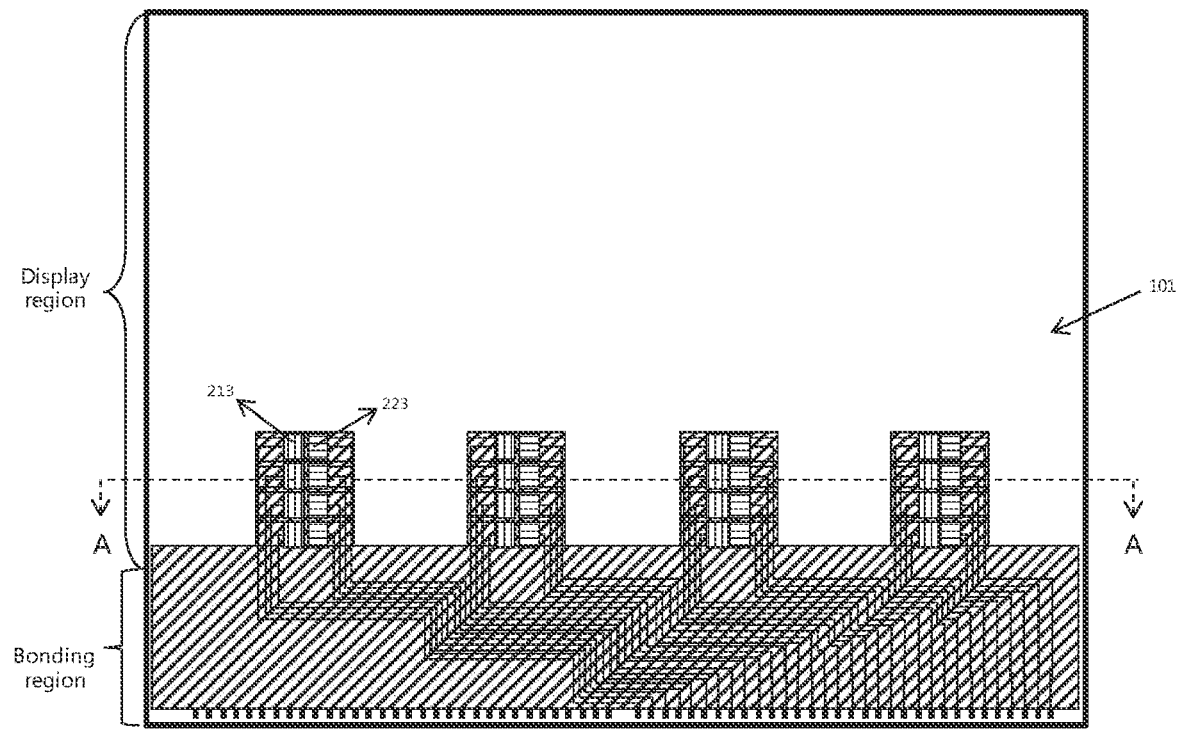
Figure 16B:
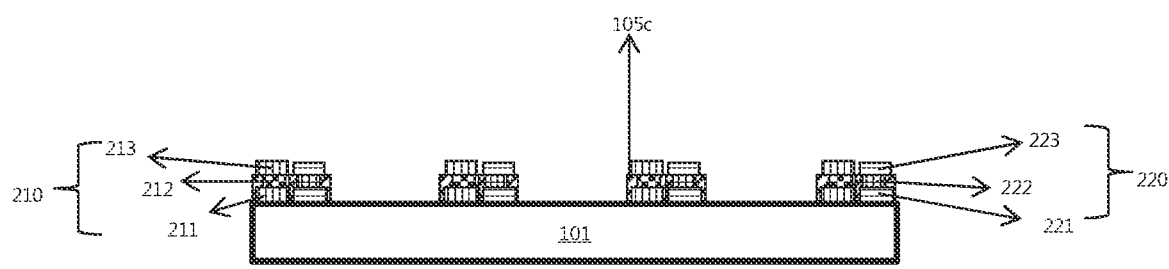

FIG. 16A is a schematic plan view of a method for manufacturing a display substrate according to an embodiment of the present disclosure. FIG. 16B is a schematic cross-sectional view taken along the line AA in FIG. 16A.

As shown in FIGS. 16A and 16B, a first upper electrode 213 is formed on the first portion 105c of the inter-pixel portion and the first piezoelectric material 212, and a second upper electrode 223 is formed on first portion 105c of the inter-pixel portion and the second piezoelectric material 222.

Specifically, forming the first upper electrode 213 and the second upper electrode 223 includes forming a second conductive layer (not shown) covering the first portion 105c of the inter-pixel portion, the first conductive material 212 and the second conductive material 222, and patterning the second conductive layer to form the first upper electrode 213 on the first portion 105c of the inter-pixel portion and the first piezoelectric material 212 and form the second upper electrode 223 on the first portion 105c of the inter-pixel portion and the second piezoelectric material 222.

In an embodiment of the present disclosure, the first lower electrode 211, the first piezoelectric material 212, and the first upper electrode 213 constitute the generator 210 of the ultrasonic fingerprint recognition sensor. The second lower electrode 221, the second piezoelectric material 222, and the second upper electrode 223 constitute the receiver 220 of the ultrasonic fingerprint recognition sensor.

In an embodiment of the present disclosure, the first lower electrode 211, the second lower electrode 221, the first upper electrode 213, and the second upper electrode 223 may be prepared through processes such as sputtering, exposure, and etching, etc.

It should be noted that, as shown in FIG. 16A, wiring for the first upper electrode 213 and the second upper electrode 223 are formed in the bonding region of the substrate 101 at the same time as the first upper electrode 213 and the second upper electrode 223 are formed. It should be noted that the design of the wiring in the bonding region of the present disclosure is only exemplary and should not be considered as a limit to the present disclosure, and those skilled in the art may design it according to actual needs.

Figure 17A:
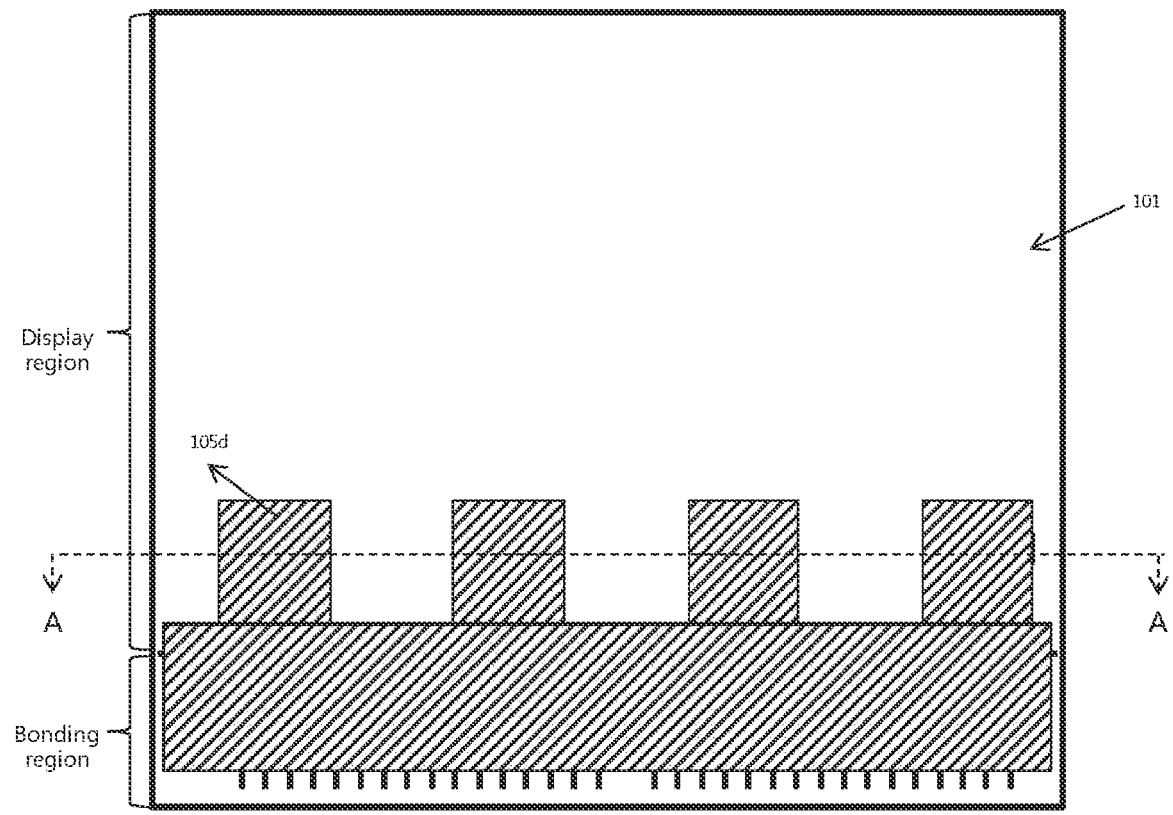
Figure 17B:
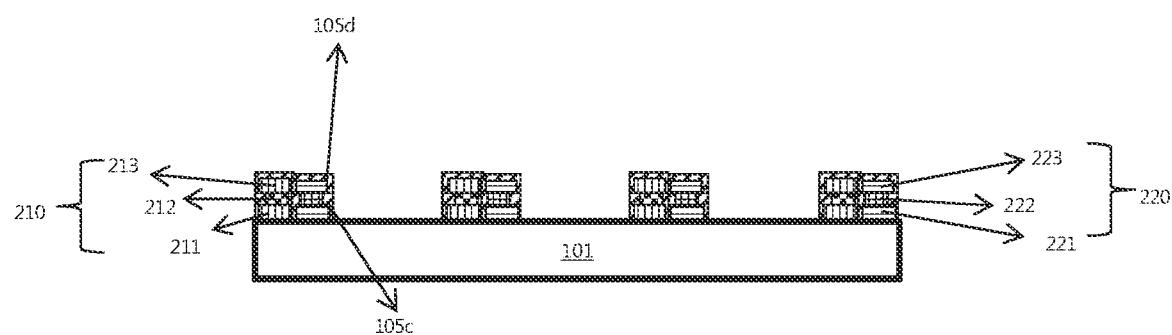

FIG. 17A is a schematic plan view of a method for manufacturing a display substrate according to an embodiment of the present disclosure. FIG. 17B is a schematic cross-sectional view taken along the line AA in FIG. 17A.

As shown in FIGS. 17A and 17B, a second portion 105*d* of the inter-pixel portion is formed on the first portion 105*c* of the inter-pixel portion, the first upper electrode 213, and the second upper electrode 223.

In an embodiment of the present disclosure, the second portion 105*d* of the inter-pixel portion also covers the wiring in the bonding region.

Further, referring to FIGS. 4 and 6, forming the light emitting device 104 includes forming an anode 1041 on the substrate 101, forming a light emitting layer 1042 on the anode 1041, and forming a cathode 1043 on the light emitting layer 1042 and the pixel definition layer 105. In addition, in an embodiment of the present disclosure, the anode 1041 of the light emitting device 104 is disposed in the same layer as the first lower electrode 211 and the second lower electrode 221, and thus may be formed at the same time.

Furthermore, in an embodiment of the present disclosure, referring to FIGS. 4 and 6, the method for manufacturing a display substrate further includes before forming the pixel definition layer 105 and the fingerprint recognition sensor, forming a TFT layer 102 on the substrate 101, and forming a planarization layer 103 on the TFT layer 102. In addition, after forming the cathode 1043, an encapsulation layer 106 is formed on the cathode 1043, and a touch layer 107 is formed on the encapsulation layer 106.

It should be noted that, in the case where the light emitting layer 1042 emits white light, the touch layer 107 further includes a color film layer, so that the display substrate 100 can implement color display.

For detailed descriptions of the substrate 101 and the TFT layer 102, reference may be made to the above description of FIG. 4 and FIG. 6, and details are not described herein again.

The foregoing description of the embodiment has been provided for purpose of illustration and description. It is not intended to be exhaustive or to limit the application. Even if not specifically shown or described, individual elements or features of a particular embodiment are generally not limited to that particular embodiment, are interchangeable when under a suitable condition, can be used in a selected embodiment and may also be varied in many ways. Such variations are not to be regarded as a departure from the application, and all such modifications are included within the scope of the application.

What is claimed is:

1. A method for manufacturing a display substrate comprising:

providing a substrate;

forming a pixel definition layer for defining pixels on the substrate, wherein each pixel comprises a light emitting device; and forming the light emitting devices on the substrate and in the pixel definition layer, the pixel definition layer comprising a plurality of inter-pixel portions located between adjacent light emitting devices, wherein forming the pixel definition layer comprises forming a fingerprint recognition sensor in the inter-pixel portion, wherein the fingerprint recognition sensor is an ultrasonic fingerprint recognition sensor, and wherein the ultrasonic fingerprint recognition sensor comprises a generator and a receiver, wherein forming the ultrasonic fingerprint recognition sensor comprises positioning the generator and the receiver in a same inter-pixel portion, and wherein forming the ultrasonic fingerprint recognition sensor comprises:

forming a first lower electrode and a second lower electrode in a region for forming the inter-pixel portion on the substrate;

forming a first portion of the inter-pixel portion covering the substrate, the first lower electrode, and the second lower electrode in the region for forming the inter-pixel portion;

forming a first hole exposing the first lower electrode and a second hole exposing the second lower electrode in the first portion of the inter-pixel portion;

forming a first piezoelectric material in the first hole, and forming a second piezoelectric material in the second hole;

forming a first upper electrode on the first portion of the inter-pixel portion and the first piezoelectric material, and forming a second upper electrode on the first portion of the inter-pixel portion and the second piezoelectric material; and forming a second portion of the inter-pixel portion on the first portion of the inter-pixel portion, the first upper electrode, and the second upper electrode.

2. The method according to claim 1, wherein forming the first lower electrode and the second lower electrode comprises:

forming a first conductive layer on the substrate; and patterning the first conductive layer to form the first lower electrode and the second lower electrode in the region for forming the inter-pixel portion, and wherein forming the first upper electrode and the second upper electrode comprises:

forming a second conductive layer covering the first portion of the inter-pixel portion, the first piezoelectric material and the second piezoelectric material; and patterning the second conductive layer to form the first upper electrode on the first portion of the inter-pixel portion and the first piezoelectric material and form the second upper electrode on the first portion of the inter-pixel portion and the second piezoelectric material.

3. The method according to claim 2, wherein forming the light emitting device comprises:

forming an anode on the substrate, wherein the anode is formed simultaneously with the first lower electrode and the second lower electrode;

forming the light emitting layer on the anode; and forming a cathode on the light emitting layer and the pixel definition layer.

* * * * *